(12) United States Patent
Yang et al.

(10) Patent No.: US 10,234,351 B2
(45) Date of Patent: Mar. 19, 2019

(54) DISPLAY SUBSTRATE AND DISPLAY DEVICE, PRESSURE DETECTION SYSTEM AND DETECTION METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiuxia Yang, Beijing (CN); Yun Qiu, Beijing (CN); Zhidong Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 173 days.

(21) Appl. No.: 15/314,467

(22) PCT Filed: Feb. 29, 2016

(86) PCT No.: PCT/CN2016/074816
§ 371 (c)(1),
(2) Date: Nov. 28, 2016

(87) PCT Pub. No.: WO2017/049872
PCT Pub. Date: Mar. 30, 2017

(65) Prior Publication Data
US 2017/0284883 A1    Oct. 5, 2017

(30) Foreign Application Priority Data

Sep. 24, 2015   (CN) .......................... 2015 1 0617530

(51) Int. Cl.
*G01L 9/12*     (2006.01)
*H01L 27/32*    (2006.01)
(Continued)

(52) U.S. Cl.
CPC .............. *G01L 9/0072* (2013.01); *G01L 9/08* (2013.01); *G01L 9/12* (2013.01); *G01L 19/083* (2013.01);
(Continued)

(58) Field of Classification Search
CPC . G01L 9/00; G01L 9/0072; G01L 9/08; G01L 9/12; G01L 19/083; H01L 27/32;
(Continued)

(56) References Cited

U.S. PATENT DOCUMENTS 7,926,351 B2 * 4/2011 Masaki ................... G01L 1/146
                                                          73/718
2008/0202251 A1 * 8/2008 Serban .................... G01L 1/142
                                                          73/780
(Continued)

FOREIGN PATENT DOCUMENTS

CN        101680813 A      3/2010
CN        101916006 A     12/2010
(Continued)

OTHER PUBLICATIONS

Office Action received for Chinese Patent Application No. 201510617530.5, dated Oct. 17, 2017, 9 pages (3 pages of English Translation and 6 pages of original Document).
(Continued)

*Primary Examiner* — Nguyen Q. Ha
(74) *Attorney, Agent, or Firm* — Womble Bond Dickinson (US) LLP

(57) ABSTRACT

Embodiments of the present invention provide a display substrate, a display device, a pressure detection system and
(Continued)

a detection method thereof, which relate to the field of display technologies and is able to integrate the ambient pressure testing function in the display substrate for the convenience of being carried by people when going out, wherein the display substrate comprises a base substrate and a pressure sensing structure located on the base substrate configured to test the ambient pressure. The pressure sensing structure comprises a first pressure sensitive electrode and a second pressure sensitive electrode arranged opposite to each other, and a plurality of insulating pillars arranged at intervals between the first pressure sensitive electrode and the second pressure sensitive electrode, wherein the first pressure sensitive electrode is in contact with the base substrate.

20 Claims, 6 Drawing Sheets

(51) Int. Cl.
  *G01L 9/00* (2006.01)
  *G01L 9/08* (2006.01)
  *G01L 19/08* (2006.01)
  *H01L 51/52* (2006.01)
(52) U.S. Cl.
  CPC ........ *H01L 27/322* (2013.01); *H01L 27/3225* (2013.01); *H01L 27/3262* (2013.01); *H01L 27/3276* (2013.01); *H01L 51/5284* (2013.01); *H01L 27/3211* (2013.01); *H01L 27/3244* (2013.01); *H01L 2227/323* (2013.01)
(58) Field of Classification Search
  CPC ............... H01L 27/3211; H01L 27/322; H01L 27/3225; H01L 27/3244; H01L 27/3262; H01L 27/3276; H01L 2227/323; H01L 51/5284; H05K 999/99
  See application file for complete search history.

(56) References Cited

U.S. PATENT DOCUMENTS

| 2012/0096944 A1 | 4/2012 | Leclerc |
| 2013/0106244 A1* | 5/2013 | Liu ..................... H01L 41/1132 310/338 |
| 2014/0152621 A1* | 6/2014 | Okayama ............... G06F 3/0416 345/174 |

FOREIGN PATENT DOCUMENTS

| CN | 101978342 A | 2/2011 | |
| CN | 103293789 A | 9/2013 | |
| CN | 103309603 A | 9/2013 | |
| CN | 103344377 A | 10/2013 | |
| CN | 203365045 U | 12/2013 | |
| CN | 104423748 A | 3/2015 | |
| CN | 105136378 A | 12/2015 | |
| CN | 204988604 U | 1/2016 | |
| CN | 204988604 U | 1/2016 | |
| EP | 0862051 A1 * | 9/1998 | ........... G01L 9/0075 |
| JP | 2002039899 A | 2/2002 | |
| RU | 2324159 | 5/2008 | |
| WO | WO 2015037197 A1 | 3/2015 | |

OTHER PUBLICATIONS

International Preliminary Report on Patentability received for PCT Patent Application No. PCT/CN2016/074816, dated Apr. 5, 2018, 14 pages (9 pages of English Translation and 5 page of Original Document).
International Search Report and Written Opinion in PCT/CN2016/074816 dated Jul. 1, 2016, with English translation. 16 pages.
"Second office action," CN Application No. 201510617530.5 (dated Oct. 17, 2017).
Office Action in Chinese Application No. 201510617530.5 dated Mar. 20, 2017, with English translation. 11 pages.

* cited by examiner

DISPLAY SUBSTRATE AND DISPLAY DEVICE, PRESSURE DETECTION SYSTEM AND DETECTION METHOD THEREOF

TECHNICAL FIELD

The present invention relates to the field of display technologies, and particularly to a display substrate, a display device, a pressure detection system and a detection method thereof.

BACKGROUND

With the continuous improvement in living standards, people are increasingly concerned about their own health and the life or environmental factors that may affect the health. For example, passengers, pilots flying at high altitude or outdoor mountaineering, adventure users, or personnel working in a submarine or diving users need to know the surrounding air pressure or water pressure to determine whether the surrounding air pressure or water pressure conform to their own body adaptability. In the prior art, however, the air pressure or water pressure is generally measured using an independent device. This therefore increases the number of items carried by people during going out, reducing the convenience in carrying items.

SUMMARY

Embodiments of the present invention provide a display substrate, a display device, a pressure detection system and a detection method thereof, which integrate the ambient pressure testing function into the display substrate for the convenience of being carried by people when going out.

To achieve the above objective, embodiments of the present invention employ the technical solution as follows.

One aspect of embodiments of the present invention provides a display substrate integrated in a display panel, comprising a base substrate and further comprising a pressure sensing structure located on the base substrate configured to test an ambient pressure. The pressure sensing structure comprises a first pressure sensitive electrode and a second pressure sensitive electrode arranged opposite to each other, and a plurality of insulating pillars arranged at intervals between the first pressure sensitive electrode and the second pressure sensitive electrode. The first pressure sensitive electrode is in contact with the base substrate.

In an optional embodiment, the display substrate is a color film substrate and further comprises a color film layer and a black matrix located on the base substrate; the pressure sensing structure is located between the base substrate and at least one of the color film layer or black matrix.

In an optional embodiment, the display substrate is a color film substrate and further comprises a color film layer composed of a first color pattern, a second color pattern and a third color pattern; the display substrate comprises a display area and a non-display area located in the periphery of the display area; the pressure sensing structure is located in the non-display area.

In an optional embodiment, the display substrate further comprises a black matrix, and the insulating pillar and the black matrix have a same material, and are located in a same layer or formed by using a same patterning process.

In an optional embodiment, the display substrate further comprises a common electrode layer located above the second pressure sensitive electrode and the color film layer, and there are materials between the common electrode layer and the second pressure sensitive electrode, which materials compose at least one of the first color pattern, the second color pattern or the third color pattern.

In an optional embodiment, the display substrate further comprises a common electrode layer, and the second pressure sensitive electrode and the common electrode layer have a same material, and are located in a same layer or formed by using a same patterning process; the insulating pillar is formed by successively superposing material that composes at least one of the first color pattern, the second color pattern, the third color pattern or the black matrix.

In an optional embodiment, the display substrate is an array substrate; the base substrate is provided with a thin film transistor array; the thin film transistor is a bottom gate type transistor; the first pressure sensitive electrode and a gate of the thin film transistor have a same material, and are located in a same layer or formed by using a same patterning process; and the insulating pillar and a gate insulating layer covering the gate have a same material, and are located in a same layer or formed by using a same patterning process.

In an optional embodiment, the display substrate is an array substrate; the base substrate is provided with a thin film transistor array; the thin film transistor is a top gate type transistor; a metal light-shielding layer and a buffer layer covering the metal light-shielding layer are arranged between the thin film transistor and the base substrate; the first pressure sensitive electrode and the metal light-shielding layer have a same material, and are located in a same layer or formed by using a same patterning process; and the insulating pillar and the buffer layer have a same material, and are located in a same layer or formed by using a same patterning process.

In an optional embodiment, each thin film transistor in the thin film transistor array corresponds to one pixel unit, and the pressure sensing structure is located in an area to which the pixel unit corresponds or located in an area outside the area to which the pixel unit corresponds.

In a further optional embodiment, one pressure sensing structure is provided for a plurality of pixel units.

In an optional embodiment, the display substrate is used for an OLED display panel and comprises an electrode insulating layer arranged at a side of the second pressure sensitive electrode away from the base substrate; the second pressure sensitive electrode is in contact with the electrode insulating layer; and a side of the electrode insulating layer away from the base substrate is provided with an OLED light-emitting element.

In an optional embodiment, the display substrate further comprises a common electrode layer located at a side of the color film layer and the black matrix away from the base substrate; and an insulating layer is provided between the second pressure sensitive electrode and at least one of the color film layer, the black matrix or the common electrode layer.

In an optional embodiment, the material composing the first pressure sensitive electrode or the second pressure sensitive electrode comprises at least one of graphene, carbon nanotubes, nano-silver, indium tin oxide or indium zinc oxide.

Another aspect of embodiments of the present invention provides a display device comprising any display substrate described above.

A further aspect of embodiments of the present invention provides a pressure detection system comprising the above display device. The system further comprises a pressure signal collector, a data processor; the pressure signal collector is connected to the first pressure sensitive electrode, the second pressure sensitive electrode in the pressure sensing structure of the display device and the data processor, and is configured to collect a capacitance value between the first pressure sensitive electrode and the second pressure sensitive electrode and output a collection result to the data processor; the data processor is further connected to the display device, and is configured to convert the capacitance value collected by the pressure signal collector into a pressure value and output it to the display device such that the display device displays the pressure value.

In an optional embodiment, the pressure detection system further comprises a memory and a comparator; the comparator is connected to the data processor, the memory and the display device, for receiving the pressure value outputted by the data processor and comparing the pressure value with a pressure threshold stored in the memory, and when the pressure value outputted by the data processor is greater than the pressure threshold, sending a prompt signal to the display device such that the display device displays a prompt message according to the prompt signal.

Yet another aspect of embodiments of the present invention provides a method of detecting a pressure using the above display device, wherein the method comprises: collecting a capacitance value between a first pressure sensitive electrode and a second pressure sensitive electrode in the display device; converting the capacitance value into a pressure value; displaying the pressure value on said display device.

In an optional embodiment, the method further comprises: comparing the pressure value with a pressure threshold, and when the pressure value is greater than the pressure threshold, sending a prompt signal to the display device such that the display device displays a prompt message according to the prompt signal.

Embodiments of the present invention provide a display substrate, a display device, a pressure detection system and a detection method thereof, wherein the display substrate comprises a base substrate and a pressure sensing structure configured to test an ambient pressure. The pressure sensing structure comprises a first pressure sensitive electrode and second pressure sensitive electrode arranged in opposite to each other, and a plurality of insulating pillars arranged at intervals between the first pressure sensitive electrode and the second pressure sensitive electrode. The first pressure sensitive electrode is in contact with the base substrate.

In this manner, a capacitance would be formed between the first pressure sensitive electrode and the second pressure sensitive electrode. When the air pressure or water pressure acts on the base substrate, the base substrate would be slightly deformed. In this case, the first pressure sensitive electrode in contact with the base substrate would be deformed under the effect of the slight deformation, so that the spacing between the first pressure sensitive electrode and the second pressure sensitive electrode changes, and consequently the capacitance value between the first pressure sensitive electrode and the second pressure sensitive electrode is changed. The above capacitance values can be collected and converted to obtain corresponding pressure values.

In addition, since the above pressure sensing structure is integrated in the display substrate, and the display substrate is widely used in some portable display devices, when the display substrate is applied to the above display devices, it is possible to display a pressure value detected by the pressure sensing structure on the display device, or compare the pressure value with a set pressure threshold and display prompt information when the pressure value exceeds the threshold. Therefore, the technical solution of the present invention can detect the external air pressure or water pressure on the basis of facilitating carrying by the user.

BRIEF DESCRIPTION OF THE DRAWINGS

In order to illustrate the embodiments of the present invention or the technical solutions in the prior art more clearly, the drawings which are required to be used for describing the embodiments or the prior art will be briefly described below. It is apparent that the drawings described below are just some embodiments of the present invention. Other technical solutions may be obtained by those ordinarily skilled in the art based on the drawings without spending inventive efforts.

REFERENCE SIGNS

01—color film substrate; 02—base substrate; 03—liquid crystal; 10—base substrate; 101—display area; 102—non-display area; 11—black matrix; 12—color film layer; 13—common electrode layer; 14—insulating layer; 20—sensing electrode structure; 201—first pressure sensitive electrode; 202—second pressure sensitive electrode; 203—insulating pillar; 210—pixel electrode; 211—gate; 212—gate insulating layer; 213—semiconductor active layer; 214—source/drain; 215—metal light-shielding layer; 216—buffer layer; 30—electrode insulating layer; 31—OLED light-emitting element; 310—first electrode layer; 311—electro injection layer; 312—electron transport layer; 313—organic light-emitting layer; 314—hole transport layer; 315—hole injection layer; 316—second electrode layer; 40—display device; 50—pressure signal collector; 60—data processor; 70—comparator; 80—memory.

DETAILED EMBODIMENTS

The technical solutions in embodiments of the present invention will be described below in a clear and complete manner with reference to the drawings in the embodiments of the present invention. It is apparent that the described embodiments are just part of the embodiments of the present invention rather than all of them. All other embodiments obtained by those ordinarily skilled in the art on the basis of the embodiments in the present invention without spending inventive efforts pertain to the protection scope of the present invention.

Figure 1:
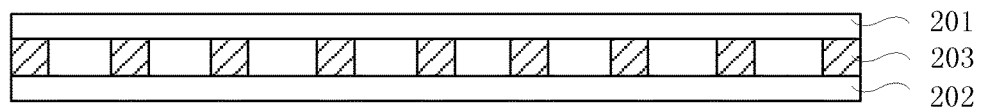
FIG. 1 is a schematic structural view of a pressure sensing structure provided by embodiments of the present invention.

Embodiments of the present invention provide a display substrate comprising a base substrate 10 (shown in FIG. 2 or FIG. 4) and a pressure sensing structure 20 shown in FIG. 1 which is located on the base substrate 10 and configured to test an ambient pressure. The pressure sensing structure may comprise a first pressure sensitive electrode 201 and a second pressure sensitive electrode 202 arranged opposite to each other, and a plurality of insulating pillars 203 arranged at intervals between the first pressure sensitive electrode 201 and a second pressure sensitive electrode 202. Moreover, the first pressure sensitive electrode 201 is in contact with the base substrate 10.

It is to be noted that the base substrate 10 is a transparent substrate and may specifically be made of glass or a resin for manufacturing various thin film layers on the substrate. For example, when the above display substrate is applied to a liquid crystal display device, the display substrate may be a color film substrate, so that a pattern of a black matrix and a color film layer can be prepared on the base substrate 10; or the above display substrate may be an array substrate so that a thin film transistor array is prepared on the base substrate 10 at one time. Furthermore, when the above display substrate is applied to an OLED (Organic Light Emitting Diode) display device, the base substrate 10 may be an encapsulation cover plate to thereby encapsulate the OLED array substrate. Alternatively, when the display substrate is used for manufacturing a flexible display panel, the base substrate 10 may further be made of flexible transparent resin material.

Figure 2:
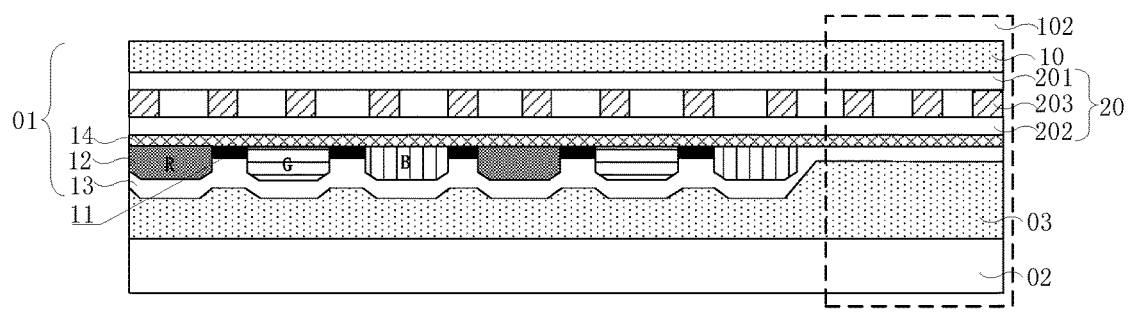
FIG. 2 is a schematic view of a structure in which the pressure sensing structure shown in FIG. 1 is integrated in a color film substrate.
Figure 7:
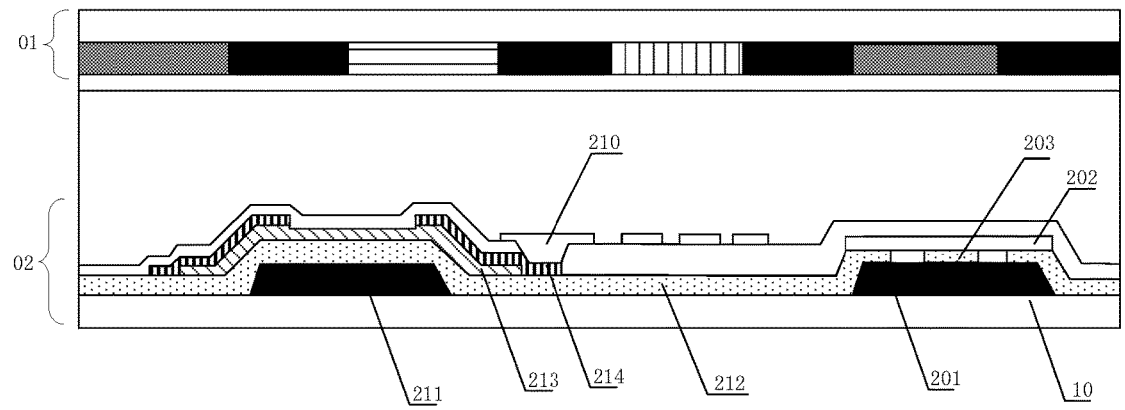
FIG. 7 is a schematic view of a structure in which the pressure sensing structure shown in FIG. 1 is integrated in an array substrate.

In order to make a distinction easily, a pressure sensitive electrode in contact with the base substrate 10 is referred to as the first pressure-sensitive electrode 201, and another pressure sensitive electrode arranged opposite to the first pressure sensitive electrode 201 is referred to as a second pressure sensitive electrode 202. The first pressure sensitive electrode 201 does not have to be closer to the light-exit display side of the display device than the second pressure sensitive electrode 202 as shown in FIG. 1. When the pressure sensing structure 20 is arranged in different types of display substrate, the relative position between the first pressure sensitive electrode 201 and the second pressure sensitive electrode 202 may be somewhat different. For example, as shown in FIG. 2, when the display substrate is a color film substrate, since the base substrate 10 of the color film substrate is located on the light-exit display side of the display device, the first pressure sensitive electrode 201 in contact with the base substrate 10 is closer to the light-exit display side of the display device than the second pressure sensitive electrode 202. For another example, when the display substrate is an array substrate as shown in FIG. 7, since the base substrate 10 of the array substrate is located on side of the display device away from the light-exit display side, the first pressure sensitive electrode 201 in contact with the base substrate is farther from the light-exit display side of the display device than the second pressure sensitive electrode 202.

The material composing the first pressure sensitive electrode 201 or the second pressure sensitive electrode 202 may include some transparent conductive materials, such as at least one of graphene, carbon nanotubes, nano-silver, indium tin oxide or indium zinc oxide. Since graphene or carbon nanotubes have higher pressure sensitive property, it is preferred to use at least one of graphene or carbon nanotubes. In addition, the material composing the insulating pillar 203 may be selected as an insulating resin material such as a photoresist material commonly used in the display field. Alternatively the resin material used for preparing the display substrate may also be used during the preparation of the insulating pillar 203 based on different display substrates.

The patterns of the first pressure sensitive electrode 201 and the insulating pillar 203 can be formed successively on the base substrate 10 by patterning process. Moreover, since it is required to form certain spacing between the first pressure sensitive electrode 201 and the second pressure sensitive electrode 202 by means of the insulating pillar 203, during the preparation of the pressure sensing structure 20, the film structure of the second pressure sensitive electrode 202 which has been prepared needs to be attached to the insulating pillar 203 so that a capacitance can be formed between the first pressure sensitive electrode 201 and the second pressure sensitive 202.

Since the ambient pressure acts on the first pressure sensitive electrode 201 of the display substrate, the entire surface of the first pressure sensitive electrode 201 would bear the above ambient pressure. However, when the user's finger touches the display substrate, the pressure applied by the user only acts on a partial surface of the first pressure sensitive electrode 201. Therefore, it is possible to set corresponding algorithms for different force receiving areas of the first pressure sensitive electrode 201 so that the display substrate can discriminate between the ambient pressure and the pressure generated by the user's touch, thereby preventing the test result of the ambient pressure from being affected by the pressure generated by the user's touch.

The patterning process described in embodiments of the present invention may include a photolithography process or include a photolithography process and an etching step, and may also include other processes such as printing, ink jetting and the like for forming a predetermined pattern. The photolithography process is a process that forms a pattern using a photoresist, a mask, an exposure machine, etc, including processes such as film formation, exposure, development, and the like. The corresponding patterning process can be selected according to the structure formed in the present invention.

The one-step patterning process in embodiments of the present invention will be described based on the example of forming different exposure regions by one-step mask exposure process and then performing removing processes such as etching, ashing, etc. multiple times on the different exposure regions to finally obtain an expected pattern.

The display substrate provided by embodiments of the present invention comprises a base substrate and a pressure sensing structure configured to test an ambient pressure. The pressure sensing structure comprises a first pressure sensitive electrode and a second pressure sensitive electrode arranged opposite to each other, and a plurality of insulating pillars arranged at intervals between the first pressure sensitive electrode and the second pressure sensitive electrode. The first pressure sensitive electrode is in contact with the base substrate.

In this manner, a capacitance would be formed between the first pressure sensitive electrode and the second pressure sensitive electrode. When the air pressure or water pressure acts on the base substrate, the base substrate would be slightly deformed. In this case, the first pressure sensitive electrode in contact with the base substrate would be also deformed under the effect of the slight deformation, so that the spacing between the first pressure sensitive electrode and the second pressure sensitive electrode changes, and consequently the capacitance value between the first pressure sensitive electrode and the second pressure sensitive electrode is changed. The above capacitance values can be collected and converted to obtain corresponding pressure values.

In addition, since the above pressure sensing structure is integrated in the display substrate, and the display substrate is widely used in some portable display device field, when the display substrate is applied to the above display devices, it is possible to display a pressure value detected by the pressure sensing structure on the display device, or compare the pressure value with a set pressure threshold and display prompt information when the pressure value exceeds the threshold. Therefore, the technical solution can detect the external air pressure or water pressure on the basis of facilitating user carrying.

The display substrate provided with the pressure sensing structure 20 will be described below in detail with reference to specific embodiments.

Embodiment I

This embodiment is described based on the example that the display substrate is a color film substrate 01.

In this case, as shown in FIG. 2, the display substrate comprises a black matrix 11 located on the base substrate 10, and the pressure sensing structure 20 is located between the black matrix 11 and the base substrate 10. The color film substrate 01 further comprises a black matrix 11 and a color film layer 12. The color film layer 12 is composed of a first color pattern, a second color pattern, and a third color pattern. The first color, the second color and the third color may be red, green and blue that constitute the three primary colors respectively, or may also be cyan, magenta and yellow. The invention is not limited to this. However, the following embodiments are all described based on the example that the first color is red (R), the second color is green (G) and the third color is blue (B).

Figure 3:
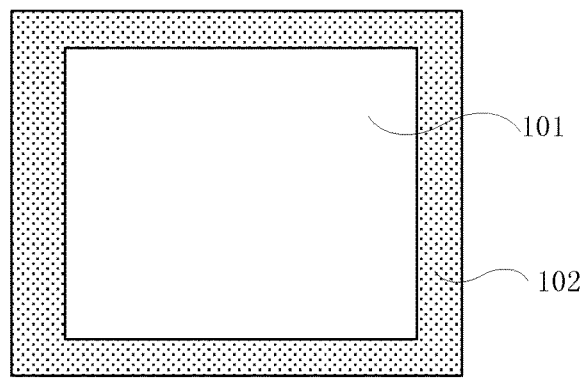
FIG. 3 is a schematic structural view of a display area and a non-display area of a display substrate provided by embodiments of the present invention.

Furthermore, when the display substrate (color film substrate 01) is applied to a TN (Twist Nematic) type display device, the display substrate further comprises, as shown in FIG. 2, a color film layer 12 and a common electrode layer 13 located on one side of the color film layer 12 away from the base substrate 10. In this case, the display substrate may comprise, as shown in FIG. 3, a display area 101 (i.e. AA area: active display area) and a non-display area 102 located in the periphery of the display area 101. Since the color film layer 12 and the black matrix do not need to be provided between the common electrode layer 13 and the second pressure sensitive electrode 202 at the non-display area 102 of the display substrate as shown in FIG. 2, in order to prevent the second pressure sensitive electrode 202 from causing signal interference to the common electrode layer 13, an insulating layer 14 may be provided between the second pressure sensitive electrode 202 and the common electrode layer 13.

It is to be noted that the TN type display device is a liquid crystal display using a vertical electric field principle, and liquid crystals 03 in the twist nematic mode are driven by forming a vertical electric field between a common electrode 13 and a pixel electrode (not shown) which are arranged on the color film substrate 01 and the array substrate 02 opposite to each other respectively. The vertical electric field liquid crystal display has the advantage of large aperture ratio.

Furthermore, the pressure sensing structure 20 may also be arranged in the non-display area 102 in order to increase the transmittance of the display substrate. Since the non-display area 102 is arranged in the periphery of the display area 101, when the pressure sensing structure 20 is arranged in the non-display area 102, the pressure sensing structure 20 may be arranged on at least one side, e.g. the left side or the right side, of the display area 101.

The structure of the display substrate will be described in detail in the following embodiments detail based on the example that the display substrate is a color film substrate 01 and the pressure sensing structure 20 is arranged in the non-display area 102, wherein when the display substrate is a color film substrate 01, the color film substrate 01 comprises a black matrix 11, a color film layer 12 and a common electrode layer 13. The color film layer 12 is composed of a first color pattern (R), a second color pattern (G) and a third color pattern (B).

Embodiment II

In this embodiment, the display substrate is a color film substrate 01 and the pressure sensing structure 20 is arranged in the non-display area 102.

Figure 4:
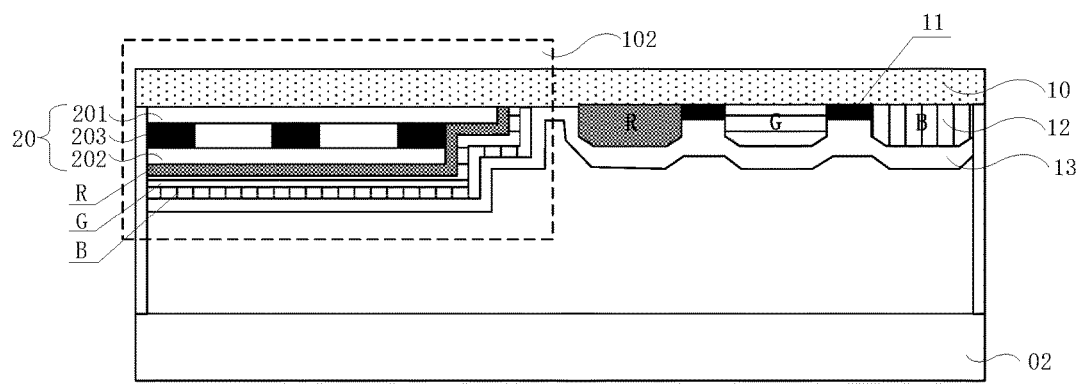
FIG. 4 is a schematic view of another structure in which the pressure sensing structure shown in FIG. 1 is integrated in a color film substrate.

Specifically, as shown in FIG. 4, there are materials between the common electrode layer 13 and the second pressure sensitive electrode 202, which materials compose at least one of the first color pattern (R), the second color pattern (G) or the third color pattern (B). In addition, the insulating pillar 203 may have the same material, and be located in the same layer or formed by using the same patterning process as the black matrix 11.

In this way, the preparation of the pressure sensing structure 20 can be completed during the preparation of the color film substrate 01. Specifically, a first pressure sensitive electrode 201 is first formed by patterning process at a position on the surface of the base substrate 10 corresponding to the non-display area 102, and a thin film layer is then coated on both the base substrate 10 and the first pressure sensitive electrode 201, the material of which is the same as that composing the black matrix 11. Then, the pattern of the insulating pillar 203 is formed on the surface of the first pressure sensitive electrode 201 by one-step mask exposure, etching process while the pattern of the black matrix 11 is formed on the surface of the base substrate, such that the insulating pillar 203 and the black matrix 11 are in the same layer and have the same material. The same layer may mean that the insulating pillar 203 is at the same level as the black matrix 11, or may also mean that the insulating pillar 203 and the black matrix 11 are simultaneously formed by one-step patterning process. Next, a film-like second pressure sensitive electrode 202, which has been manufactured, is attached to the surface of the insulating pillar 203, thereby completing the preparation of the sensing electrode structure 20. Specifically, for example, the manufactured film-like second pressure sensitive electrode 202 can be placed on the surface of the insulating pillar 203 by a manipulator, and then the second pressure sensitive electrode 202 is fixed to the surface of the insulating pillar 203 by hot pressing process.

Certainly, the common electrode layer 13 and the second pressure sensitive electrode 202 may further comprise a thin film layer therebetween which is made of other insulating materials and has insulating function.

On such basis, a stack structure can be formed on the surface of the second pressure sensitive electrode 202 by successively superposing materials that compose at least one of the first color pattern (R), the second color pattern (G) or the third color pattern (B) while forming the first color pattern (R), the second color pattern (G) and the third color pattern (B) by patterning process successively. Then, a common electrode layer 13 is prepared on the surface formed with the above structure. In this manner, for the TN type display device in which the common electrode layer 13 is prepared on the color film substrate 01, it is not necessary to individually add the step of preparing the insulating layer so as to avoid the influence of the second pressure sensitive electrode 202 on the common electrode layer 13. Since the material composing the color film layer 12 is a resin material having insulating property, it is possible to form, during the preparation of the color film layer 12, a stack structure by successively superposing the materials that compose the first color pattern (R), the second color pattern (G) and the color pattern (B) as the insulating layer between the second pressure sensitive electrode 202 and the common electrode layer 13.

Embodiment III

In this embodiment, the display substrate is a color film substrate 01 and the pressure sensing structure 20 is arranged in the non-display area 102. This embodiment differs from the embodiment II in that the material of the insulating pillar 203 is different, and the common electrode layer 13 and the second pressure sensitive electrode 202 can be multiplexed.

Figure 5:
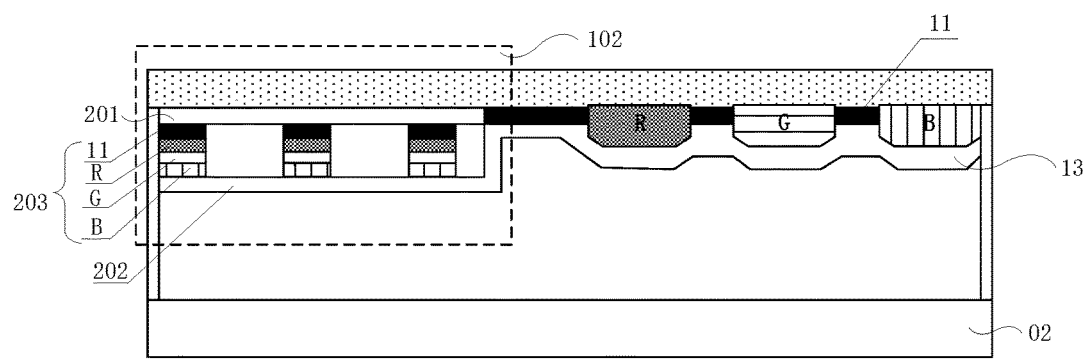
FIG. 5 is a schematic view of a further structure in which the pressure sensing structure shown in FIG. 1 is integrated in a color film substrate.

Specifically, as shown in FIG. 5, the second pressure sensitive electrode 202 and the common electrode layer 13 are in a same layer and have a same material. The insulating pillar 203 is formed by superimposing the materials that compose at least one of the black matrix 11, the first color pattern (R), the second color pattern (G) or the third color pattern (B) successively.

In this way, the preparation of the pressure sensing structure 20 can also be completed during the preparation of the color film substrate 01. Specifically, a first pressure sensitive electrode 201 is first formed by patterning process at a position on the surface of the base substrate 10 corresponding to the non-display area 102, and a black matrix 11, a first color pattern (R), a second color pattern (G) and a third color pattern (B) are then formed by patterning process on the base substrate 10 successively. Meanwhile, an insulating pillar 203 formed by stacking the materials that compose at least one of the black matrix 11, the first color pattern (R), the second color pattern (G) or the third color pattern (B) can be formed on the first pressure sensitive electrode 201, successively. Next, a film-like transparent conductive layer which has been prepared is attached to the surface of the substrate formed with above structure, to thereby form a common electrode layer 13 at a position corresponding to the display area 101 and form a second pressure sensitive electrode 202 at a position corresponding to the non-display area 102, such that the second pressure sensitive electrode 202 and the common electrode layer 13 are in a same layer and have a same material. This enables the common electrode layer 13 and the second pressure sensitive electrode 202 to be multiplexed. To enable the formed common electrode layer 13 to achieve better adhesion to the black matrix 11 and the color film layer 12, the material of carbon nanotubes with high flexibility can be selected to make up the transparent conductive layer.

As compared to the solution provided by Embodiment II, in this embodiment, when the second pressure sensitive electrode 202 is connected to the common electrode layer 13, the first pressure sensitive electrode 201 and the common electrode layer 13 may be a same thin film layer. Thus, this thin film layer can be used not only as the first pressure sensitive electrode 201 but also as the common electrode layer 13 so that the common electrode layer 13 and the second pressure sensitive electrode 202 can be multiplexed. In this way, no special process or step is required to disconnect the common electrode layer 13 from the second pressure sensitive electrode 202 during the preparation, thereby simplifying the manufacturing process.

In conclusion, the above embodiments are all described based on the example that the display substrate is a color film substrate 01. Of course, the display substrate may be an array substrate 02 applied to a liquid crystal display device, or may further be an array substrate 02 applied to an OLED display device.

Figure 6A:
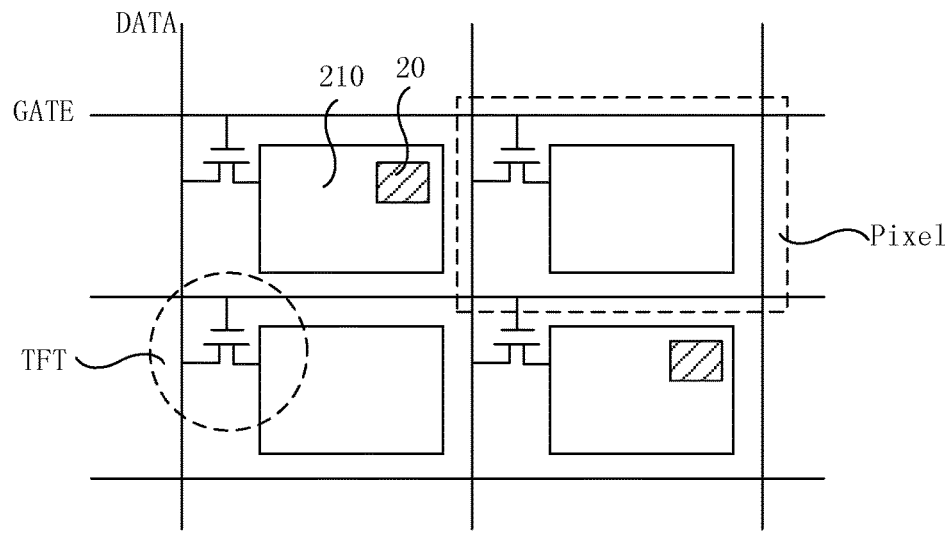
FIG. 6a is a schematic view showing one setting position of the pressure sensing structure shown in FIG. 1 when the pressure sensing structure is integrated in an array substrate.
Figure 6B:
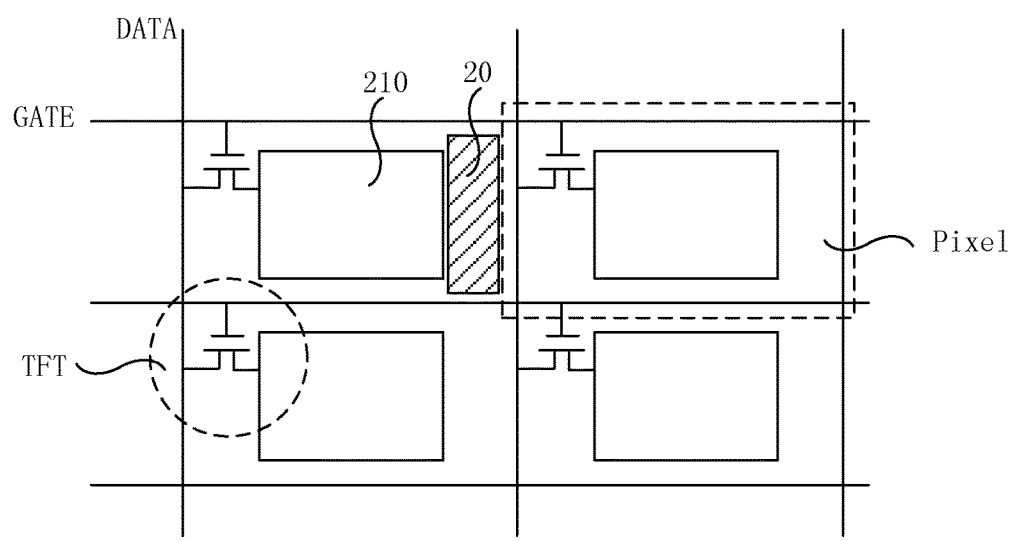
FIG. 6b is a schematic view showing another setting position of the pressure sensing structure shown in FIG. 1 when the pressure sensing structure is integrated in an array substrate.

When the display substrate is an array substrate, the array substrate comprises, as shown in FIG. 6a or 6b, a plurality of criss-crossing gate lines "GATE" and data lines "DATA". The gate lines and the data lines intersect each other to define a plurality of pixel units "Pixel" arranged in the form of a matrix. Each pixel unit is provided with a thin film transistor TFT, thereby forming a TFT array on the base substrate 10 of the array substrate 02. Moreover, the drain of each TFT is connected to a pixel electrode 210.

In this case, the pressure sensing structure 20 can be arranged in an area to which the pixel unit Pixel corresponds as shown in FIG. 6a. Alternatively, as shown in FIG. 6b, the pressure sensing structure 20 is arranged in an area outside the area to which the pixel unit Pixel corresponds. On such basis, one pressure sensing structure 20 may be arranged in each pixel unit "Pixel", or one pressure sensing structure 20 may be selectively arranged in several pixel units "Pixel". Furthermore, the pressure sensing structure 20 may further be arranged in the non-display region 101 as shown in FIG. 3. The present invention does not make limitation in this regard.

As the TFT can be classified into a bottom gate type TFT and a top gate type TFT, according to the different types of TFTs, the following embodiments will describe the solution in which the pressure sensing structure 20 is integrated in the array substrate 20.

Embodiment IV

In this embodiment, the display substrate is an array substrate 02, and the TFT on the array substrate 02 is a bottom gate type TFT. Specifically, as shown in FIG. 7, a gate 211 is in contact with the base substrate 10, and a gate insulating layer 212 covers the gate 211. Therefore, the gate 211 is closer to the base substrate 10 than the gate insulating layer 212, thereby constituting the bottom gate type TFT.

In this case, the first pressure sensitive electrode 201 in the pressure sensing structure 20 may be in the same layer and have the same material as the gate 211 of the thin film transistor TFT, and the insulating pillar 203 may be in the same layer and have the same material as the gate insulating layer 212 covering the gate 211. In this manner, the preparation of the first pressure sensitive electrode 201 and the insulating pillar 203 of the pressure sensing structure 20 can be completed during the preparation of the TFT.

Specifically, a gate metal layer can be first deposited on the base substrate 10, and the patterns of the gate 211 and the first pressure sensitive electrode 201 are then formed simultaneously by one-step patterning process. Then, the surface of the substrate formed with the above patterns is coated with a gate insulating layer, and a plurality of insulating pillars 203 arranged at intervals are then formed by patterning process at a position of the gate insulating layer corresponding to the first pressure sensitive electrode 201. Thereafter, a film-like second pressure sensitive electrode 202 which has been prepared is attached to the surface of the insulating pillar 203, thereby completing the preparation of the pressure sensing structure 20. Next, a semiconductor active layer 213 and a source/drain 214 of the TFT, etc. are formed by subsequent patterning process successively on the surface of the gate insulating layer 212.

Embodiment V

Figure 8:
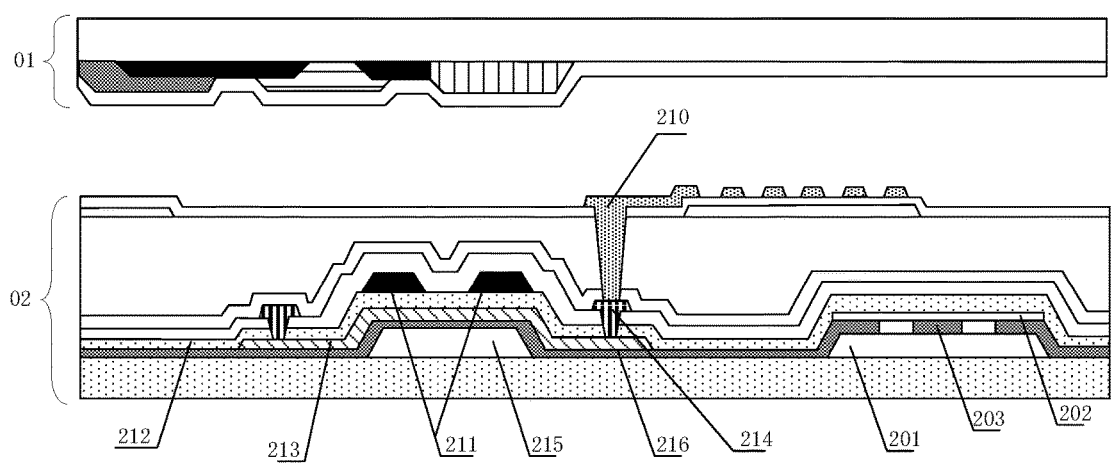
FIG. 8 is a schematic view of another structure in which the pressure sensing structure shown in FIG. 1 is integrated in an array substrate.

In this embodiment, the display substrate is an array substrate 02, and the TFT on the array substrate 02 is a top gate type TFT. Specifically, as shown in FIG. 8, the gate 211 is farther from the base substrate 10 than the gate insulating layer 212, thereby constituting the top gate type TFT. Moreover, in order to prevent light from irradiating the channel region of the TFT, a metal light-shielding layer 215 can be arranged at a position on the surface of the base substrate 10 corresponding to the channel region, thereby preventing light from directly irradiating the channel region and consequently reducing the leakage current of the TFT. Furthermore, since the metal light-shielding layer 215 is prepared using a metal material, it is further required to cover a buffer layer 216 having insulating property on the surface of the metal light-shielding layer 215.

In this case, the first pressure sensitive electrode 201 in the pressure sensing structure 20 may be in the same layer and have the same material as the metal light-shielding layer 215, and the insulating pillar 203 may be in the same layer and have the same material as the buffer layer 216. In this way, the preparation of the pressure sensing structure 20 can be completed during the preparation of the TFT, and the specific preparation process thereof can refer to Embodiment IV, which are not described here for simplicity.

Furthermore, the TFT structure in this embodiment employs double gates, that is, employing two gates 211. In this way, the length of the channel of the TFT region can be increased, and the length of the channel is inversely proportional to the leakage current of the TFT. Therefore, the above structure can further reduce the leakage current of the TFT.

In conclusion, Embodiment IV and Embodiment V are described based on the example that the display substrate is an array substrate 02. Furthermore, when the display substrate comprises an OLED light-emitting element, the specific arrangement manner of the pressure sensing structure is described in the following embodiment.

Embodiment VI

Figure 9:
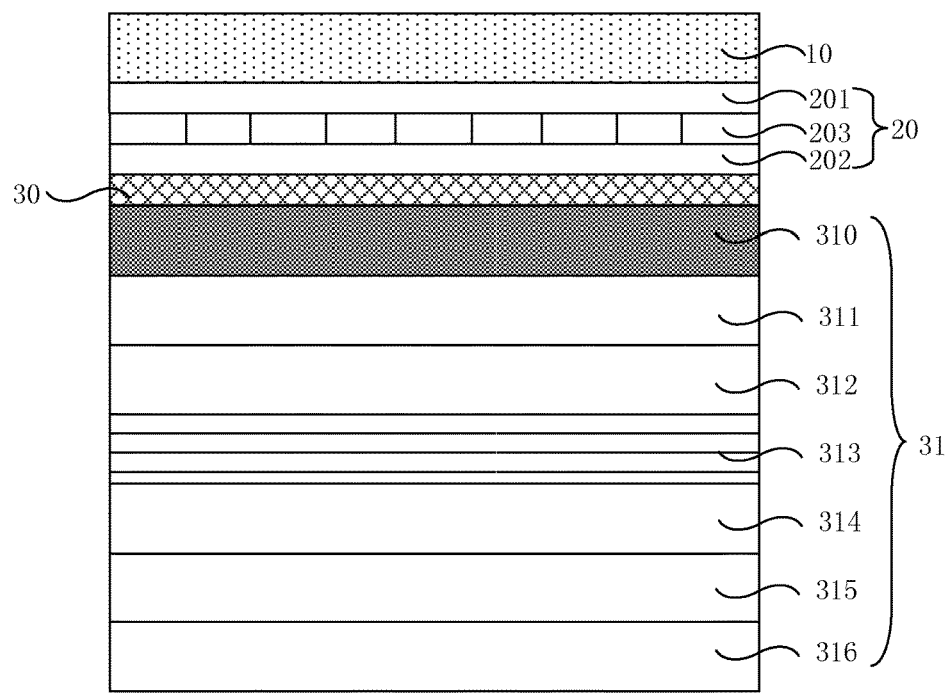
FIG. 9 is a schematic view of another structure in which the pressure sensing structure shown in FIG. 1 is integrated in an OLED display panel.

As shown in FIG. 9, the display substrate comprises an electrode insulating layer 30 arranged on one side of the second pressure sensitive electrode 202 away from the base substrate 10, and the second pressure sensitive electrode is in contact with the electrode insulating layer 30, while the first pressure sensitive electrode 201 is in contact with the base substrate 10. In addition, the electrode insulating layer 30 is provided with an OLED light-emitting element 31 on one side away from the base substrate 10, wherein the OLED light-emitting element 31 may comprise a first electrode layer 310, an electron injection layer 311, an electron transport layer 312, an organic light emitting layer 313, a hole transport layer 314, a hole injection layer 315 and a second electrode layer 316 successively located on the surface of the electrode insulating layer 30. It is to be noted that the first electrode layer 310 may be a cathode and the second electrode layer 316 may be an anode. The OLED light-emitting element 31 can be classified into a top emission type and a bottom emission type. For a top emission type OLED light-emitting element 31, the first electrode layer 310 is a transparent electrode and the second electrode layer 316 may be an opaque electrode. For a bottom emission type OLED light-emitting element 31, the first electrode layer 310 may be an opaque and the second electrode layer 316 may be a transparent electrode.

On such basis, the pressure sensing structure 20 may be positioned between the base substrate 10 and the electrode insulating layer 30, and the first pressure sensitive electrode 201 is in contact with the base substrate 10 and the second pressure sensitive electrode 202 is in contact with the electrode insulating layer 30, so that the pressure sensing structure 20 can be integrated in an OLED display panel.

Embodiments of the present invention provide a display device comprising any of the display substrates described above. The display device has the same beneficial effects as the display substrate provided in the foregoing embodiments. The structure and beneficial effects of the display substrate have been described in detail in the foregoing embodiments, which are not described here for simplicity.

It is to be noted that in the embodiments of the present invention, the display device may specifically comprise a liquid crystal display device. For example, the display device may be any product or component having display function such as liquid crystal display, liquid crystal television, digital photo frame, mobile phone, tablet computer, and so on.

Figure 10:
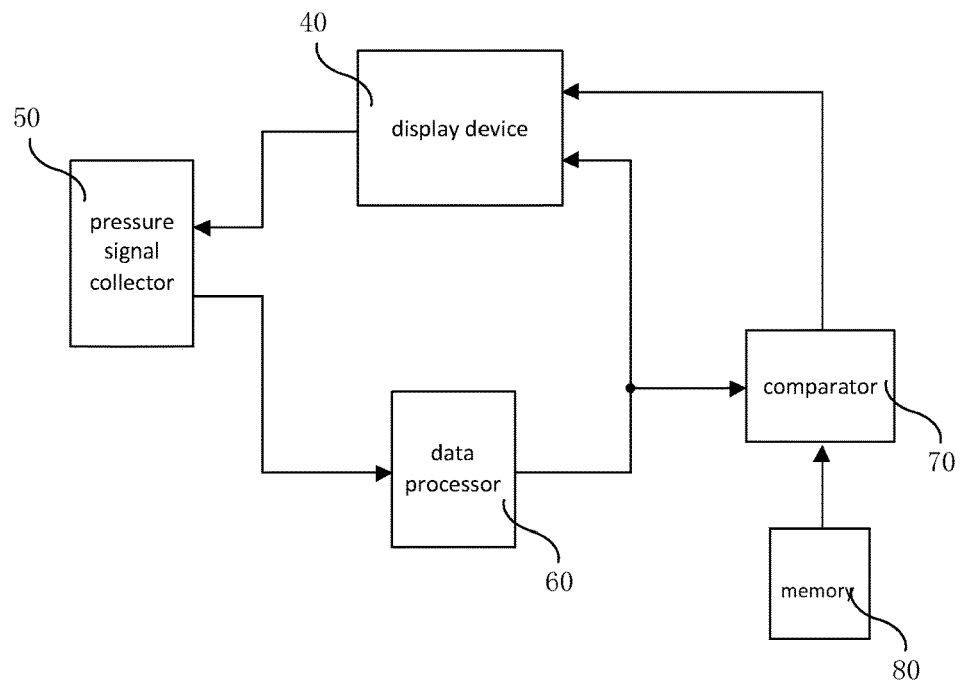
FIG. 10 is a schematic structural view of a pressure detection system provided by embodiments of the present invention.

Embodiments of the present invention provide a pressure detection system. As shown in FIG. 10, the pressure detection system comprises a display device 40 as described above, and further comprises a pressure signal collector 50 and a data processor 60.

Specifically, the pressure signal collector 50 is connected to the first pressure sensitive electrode 201, the second pressure sensitive electrode 202 and the data processor 60 in the pressure sensing structure 20 of the display device 40, and is configured to collect a capacitance value between the first pressure sensitive electrode 201 and the second pressure sensitive electrode 202, and output the collection result to the data processor 60.

The data processor is further connected to a display device 40, and is configured to convert the capacitance value collected by the pressure signal collector 50 into a pressure value and output it to the display device 40 so that the display device 40 displays the pressure value.

In this way, by means of the above pressure detection system, the external air pressure or water pressure can be detected and the detection result can be displayed, so that the user is aware of the external air pressure or water pressure at any time, thereby determining whether the external environment conforms to the body adaptability.

On such basis, the above pressure detection system further comprises a memory 70 and a comparator 80.

The comparator 70 is connected to the data processor 60, the memory 80 and the display device 40 and is configured to receive the pressure value outputted by the data processor 60 and compare the pressure value with a pressure threshold stored in the memory 80. When the pressure value outputted by the data processor 60 is greater than the pressure threshold, a prompt signal is sent to the display device 40 so that the display device 40 displays a prompt message based on the prompt signal. In this case, it is not necessary to artificially determine whether or not the pressure value conforms to the user's own body condition. Determination is made by comparing the detected pressure value with the pressure threshold using the pressure detection system. When the detected pressure value exceeds the threshold, the prompt message is displayed by the display device so as to alert the user. This avoids adverse impacts on the health caused by the user's judgment errors.

It is to be noted that the above pressure threshold may be an external pressure limit value the user can withstand which is obtained after measurement in medical facilities. When the pressure value exceeds the above limit value, it may adversely affect the user's body. Alternatively, the above pressure threshold may also be set as required by the user. For example, for some fishing enthusiasts, the above threshold value may be set according to the fish stratification and activity in water, so that fishing can be performed according to a prompt signal displayed by the display device 40, which can facilitate the user to catch a fish. Certainly, the above is only an example of setting the pressure threshold value.

Figure 11:
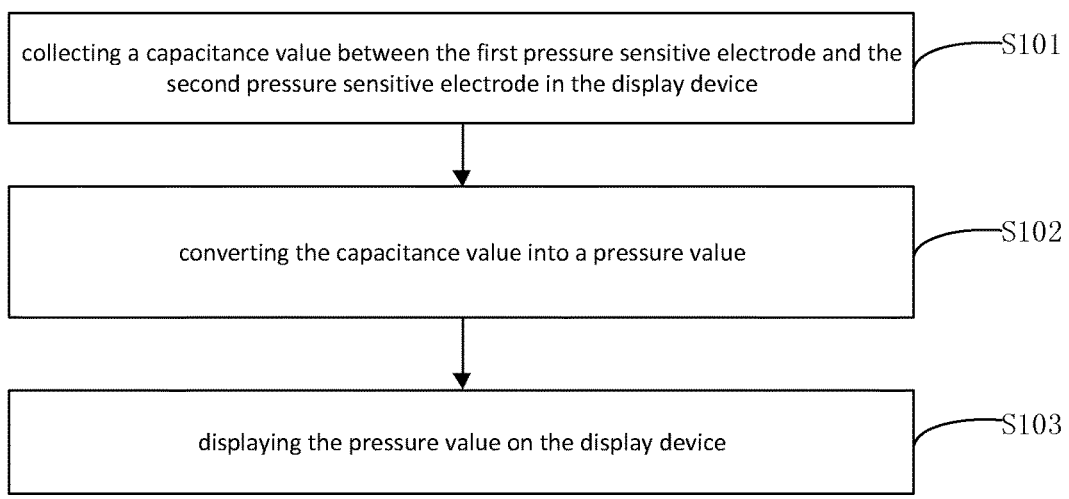
FIG. 11 is a flow chart of a pressure detection method provided by embodiments of the present invention.

Embodiments of the present invention provide a method of detecting a pressure using the above display device. As shown in FIG. 11, the detection method comprises the steps of:

At S101, collecting a capacitance value between the first pressure sensitive electrode 201 and the second pressure sensitive electrode 202 in the display device 40. Specifically, the capacitance value between the first pressure sensitive electrode 201 and the second pressure sensitive electrode 202 can be collected by the pressure signal collector 50, and the collection result is outputted to the data processor 60.

At S102, converting the capacitance value into a pressure value. Specifically, for example, the capacitance value collected by the pressure signal collector 50 is converted into a pressure value by the data processor 60 and the pressure value is outputted to the display device 40.

At S103, displaying the pressure value on the display device 40. Specifically, for example, the pressure value is displayed by the display device 40.

In this manner, by means of the above pressure detection method, the external air pressure or water pressure can be detected and the detection result can be displayed, so that the user is aware of the external air pressure or water pressure at any time, thereby determining whether the external environment conforms to the body adaptability.

On such basis, the above method further comprises the step of:

comparing the pressure value with the pressure threshold, and displaying a prompt message by the display device 40 based on the prompt signal when the pressure value is greater than the pressure threshold. Specifically, for example, the comparator 70 receives the pressure value outputted by the data processor 60 and compares the pressure value with the pressure threshold stored in the memory 80. When the pressure value outputted by the data processor 60 is greater than the pressure threshold, a prompt signal is sent to the display device 41. Then, the display device 40 performs display based on the prompt signal.

In this case, it is not necessary to artificially determine whether or not the pressure value conforms to the user's own body condition. Determination is made by comparing the detected pressure value with the pressure threshold using the pressure detection system. When the detected pressure value exceeds the threshold, the prompt message is displayed by the display device so as to alert the user. This not only provides convenience for the user but also avoids adverse impacts on the health caused by the user's judgment errors.

It can be understood by those ordinarily skilled in the art that all or partial steps for carrying out the above method embodiment can be accomplished by hardware related to programs and instructions. The aforementioned programs can be stored in a computer-readable storage medium. When the programs are executed, the steps including the above method embodiment are executed. The aforementioned storage medium includes various kinds of media such as ROM, RAM, magnetic disk, optical disk, and the like on which program codes can be stored.

The above embodiments are only specific embodiments of the present invention, but the protection scope of the present invention is not so limited. Variations or replacements that can be easily conceived by any skilled person familiar with this technical field within the technical scope revealed by the present invention shall be encompassed within the protection scope of the present invention. Thus, the protection scope of the present invention shall be based on the protection scope of the claims. It is to be noted that the wording "comprising" does not exclude other elements or steps not listed in the claims. The wording "a" or "an" preceding an element does not exclude a plurality of such elements. The mere fact that certain measures are recited in mutually different dependent claims does not indicate that a combination of these measures cannot be used to advantage. Any reference signs in the claims should not be construed as limiting the scope.

The invention claimed is:

1. A display substrate integrated in a display panel, comprising a base substrate, wherein
the display substrate further comprises a pressure sensing structure located on the base substrate configured to test an ambient pressure, the pressure sensing structure comprising a first pressure sensitive electrode and a second pressure sensitive electrode arranged opposite to each other, and a plurality of insulating pillars arranged at intervals between the first pressure sensitive electrode and the second pressure sensitive electrode,
wherein the first pressure sensitive electrode is in contact with the base substrate,
wherein each of the plurality of insulating pillars has a first end and a second end opposite to each other, the first end is directly in contact with the first pressure sensitive electrode, and the second end is directly in contact with the second pressure sensitive electrode.

2. The display substrate according to claim 1, wherein the display substrate is a color film substrate and further comprises a color film layer and a black matrix located on the base substrate;
the pressure sensing structure is located between the base substrate and at least one of the color film layer or black matrix.

3. The display substrate according to claim 2, wherein the display substrate further comprises a common electrode layer located at one side of the color film layer and the black matrix away from the base substrate;
an insulating layer is provided between the second pressure sensitive electrode and at least one of the color film layer, the black matrix or the common electrode layer.

4. The display substrate according to claim 1, wherein the display substrate is a color film substrate and further comprises a color film layer composed of a first color pattern, a second color pattern and a third color pattern; the display substrate comprises a display area and a non-display area located in the periphery of the display area; the pressure sensing structure is located in the non-display area.

5. The display substrate according to claim 4, wherein the display substrate further comprises a black matrix, the insulating pillar and the black matrix having a same material, and being located in a same layer or formed by using a same patterning process.

6. The display substrate according to claim 5, wherein the display substrate further comprises a common electrode layer located above the second pressure sensitive electrode and the color film layer, and there are materials between the common electrode layer and the second pressure sensitive electrode, which materials compose at least one of the first color pattern, the second color pattern or the third color pattern.

7. The display substrate according to claim 4, wherein
the display substrate further comprises a common electrode layer, the second pressure sensitive electrode and the common electrode layer having a same material, and being located in a same layer or formed by using a same patterning process;
the insulating pillar is formed by successively superposing materials that compose at least one of the first color pattern, the second color pattern, the third color pattern or the black matrix.

8. The display substrate according to claim 1, wherein the display substrate is an array substrate, the base substrate is provided with a thin film transistor array, the thin film transistor is a top gate type transistor, and a metal light-shielding layer and a buffer layer covering the metal light-shielding layer are arranged between the thin film transistor and the base substrate;
the first pressure sensitive electrode and the metal light-shielding layer have a same material, and are located in a same layer or formed by using a same patterning process;
the insulating pillar and the buffer layer have a same material, and are located in a same layer or formed by using a same patterning process.

9. The display substrate according to claim 8, wherein each thin film transistor in the thin film transistor array corresponds to one pixel unit, and the pressure sensing structure is located in an area to which the pixel unit corresponds or located in an area outside the area to which the pixel unit corresponds.

10. The display substrate according to claim 9, wherein one pressure sensing structure is provided for a plurality of pixel units.

11. The display substrate according to claim 1, wherein
the display substrate is an array substrate, the base substrate is provided with a thin film transistor array, the thin film transistor is a bottom gate type transistor, the first pressure sensitive electrode and a gate of the thin film transistor have a same material, and are located in a same layer or formed by using a same patterning process, and the insulating pillar and a gate insulating layer covering the gate have a same material, and are located in a same layer or formed by using a same patterning process.

12. The display substrate according to claim 11, wherein each thin film transistor in the thin film transistor array corresponds to one pixel unit, and the pressure sensing structure is located in an area to which the pixel unit corresponds or located in an area outside the area to which the pixel unit corresponds.

13. The display substrate according to claim 12, wherein one pressure sensing structure is provided for a plurality of pixel units.

14. The display substrate according to claim 1, wherein the display substrate is used for an OLED display panel and comprises an electrode insulating layer arranged at one side of the second pressure sensitive electrode away from the base substrate, the second pressure sensitive electrode is in contact with the electrode insulating layer, and one side of the electrode insulating layer away from the base substrate is provided with an OLED light-emitting element.

15. The display substrate according to claim 1, wherein a material that composes the first pressure sensitive electrode or the second pressure sensitive electrode comprises at least one of graphene, carbon nanotubes, nano-silver, indium tin oxide or indium zinc oxide.

16. A display device comprising the display substrate according to claim 1.

17. A pressure detection system comprising the display device according to claim 16, further comprising a pressure signal collector, a data processor;
the pressure signal collector being connected to the first pressure sensitive electrode, the second pressure sensitive electrode in the pressure sensing structure of the display device and the data processor, and being configured to collect a capacitance value between the first pressure sensitive electrode and the second pressure sensitive electrode and output a collection result to the data processor;
the data processor being further connected to the display device, and being configured to convert the capacitance value collected by the pressure signal collector into a pressure value and output it to the display device such that the display device displays the pressure value.

18. The pressure detection system according to claim 17, further comprising a memory and a comparator;
the comparator being connected to the data processor, the memory and the display device, and being configured to receive the pressure value outputted by the data processor and compare the pressure value with a pressure threshold stored in the memory, and when the pressure value outputted by the data processor is greater than the pressure threshold, send a prompt signal to the display device such that that the display device displays a prompt message according to the prompt signal.

19. A method of detecting a pressure using the display device of claim 16, the method comprising:
collecting a capacitance value between a first pressure sensitive electrode and a second pressure sensitive electrode in the display device;
converting the capacitance value into a pressure value;
displaying the pressure value on said display device.

20. The method according to claim 19, further comprising:
comparing the pressure value with a pressure threshold, and when the pressure value is greater than the pressure threshold, sending a prompt signal to the display device such that the display device displays a prompt message according to the prompt signal.

* * * * *